(12) United States Patent
Dhindsa

(10) Patent No.: US 10,161,042 B2
(45) Date of Patent: *Dec. 25, 2018

(54) APPARATUS FOR CHANGING AREA RATIO IN A PLASMA PROCESSING SYSTEM

(71) Applicant: Lam Research Corporation, Fremont, CA (US)

(72) Inventor: Rajinder Dhindsa, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 909 days.

This patent is subject to a terminal disclaimer.

(21) Appl. No.: 13/670,350

(22) Filed: Nov. 6, 2012

(65) Prior Publication Data

US 2013/0062321 A1    Mar. 14, 2013

Related U.S. Application Data

(62) Division of application No. 12/367,450, filed on Feb. 6, 2009, now Pat. No. 8,342,122.

(Continued)

(51) Int. Cl.
*H01J 37/32* (2006.01)
*C23C 16/52* (2006.01)
(Continued)

(52) U.S. Cl.
CPC ........... *C23C 16/52* (2013.01); *C23C 16/505* (2013.01); *C23C 16/5096* (2013.01);
(Continued)

(58) Field of Classification Search
None
See application file for complete search history.

(56) References Cited

U.S. PATENT DOCUMENTS 5,919,332 A * 7/1999 Koshiishi ............ C23C 16/5096
118/723 E
6,074,518 A    6/2000 Imafuku et al.
(Continued)

FOREIGN PATENT DOCUMENTS

JP    1992-4100230 A    4/1992
JP    1992-4278535 A    10/1992
(Continued)

*Primary Examiner* — Sylvia MacArthur
(74) *Attorney, Agent, or Firm* — Martine Penilla Group, LLP

(57) ABSTRACT

A plasma processing system has an upper electrode and a lower electrode. The upper electrode includes a first and a second upper electrode portions. The first upper electrode portion annularly surrounds the second upper electrode portion. The lower electrode includes a first and a second lower electrode portions, and the first lower electrode portion annularly surrounds the second lower electrode portion. A radio frequency (RF) power source provides RF energy to the second lower electrode portion. The lower surface of the first upper electrode portion is non-planar with a substrate-facing surface of the second upper electrode portion such that the first gap between the lower surface of the first upper electrode portion and the upper surface of the first lower electrode portion is smaller than the second gap between the substrate bearing surface of the second lower electrode portion and the substrate-facing surface of the second upper electrode portion.

20 Claims, 7 Drawing Sheets

Related U.S. Application Data

(60) Provisional application No. 61/065,174, filed on Feb. 8, 2008.

(51) Int. Cl.
*H05H 1/24* (2006.01)
*C23C 16/505* (2006.01)
*C23C 16/509* (2006.01)
*C23C 16/50* (2006.01)
*H05H 1/46* (2006.01)

(52) U.S. Cl.
CPC .. *H01J 37/32082* (2013.01); *H01J 37/32091* (2013.01); *H01J 37/32568* (2013.01); *H05H 1/24* (2013.01); *C23C 16/50* (2013.01); *C23C 16/509* (2013.01); *H01J 37/32449* (2013.01); *H01J 37/32532* (2013.01); *H01J 37/32816* (2013.01); *H05H 2001/466* (2013.01)

(56) References Cited

U.S. PATENT DOCUMENTS

| | | | | |
|---|---|---|---|---|
| 6,391,787 | B1 * | 5/2002 | Dhindsa | H01J 37/32009 118/723 R |
| 6,716,762 | B1 * | 4/2004 | Lenz | 438/710 |
| 7,323,080 | B2 * | 1/2008 | Kim et al. | 156/345.33 |
| 7,861,667 | B2 * | 1/2011 | Fischer | H01J 37/32541 118/723 E |
| 8,342,122 | B2 * | 1/2013 | Dhindsa | 118/723 E |
| 2005/0133160 | A1 * | 6/2005 | Kennedy | C23C 16/45565 156/345.34 |
| 2005/0178505 | A1 * | 8/2005 | Kim | 156/345.47 |
| 2007/0187038 | A1 * | 8/2007 | Ren | H01J 37/32009 156/345.43 |
| 2007/0284045 | A1 * | 12/2007 | Fischer | H01J 37/32082 156/345.43 |
| 2008/0090417 | A1 * | 4/2008 | De La Llera | H01J 37/32009 438/689 |
| 2008/0149596 | A1 * | 6/2008 | Dhindsa | H01J 37/3244 216/67 |
| 2009/0111276 | A1 * | 4/2009 | Dhindsa | C23C 16/4557 438/710 |
| 2009/0200269 | A1 * | 8/2009 | Kadkhodayan et al. | 216/71 |
| 2013/0062321 | A1 * | 3/2013 | Dhindsa | 219/121.36 |

FOREIGN PATENT DOCUMENTS

| | | |
|---|---|---|
| JP | 1994-6209780 A | 8/1994 |
| JP | 1996-8264515 A | 10/1996 |

* cited by examiner

APPARATUS FOR CHANGING AREA RATIO IN A PLASMA PROCESSING SYSTEM

PRIORITY CLAIM

This is a divisional application of U.S. patent application Ser. No. 12/367,450, filed on Feb. 6, 2009, entitled "Methods and Apparatus for Changing Area Ratio in A Plasma Processing System", which claims priority under 35 U.S.C. § 119(e) to a provisional patent application entitled "METHODS AND APPARATUS FOR CHAGNING AREA RATIO IN A PLASMA PROCESSING SYSTEM," by Rajinder Dhindsa, Application Ser. No. 61/065,174, filed on Feb. 8, 2008, all of which are incorporated herein by reference.

BACKGROUND OF THE INVENTION

Advances in plasma processing have facilitated growth in the semiconductor industry. The semiconductor industry is a highly competitive market. The ability for a manufacturing company to be able to process substrates in different processing conditions may give the manufacturing company an edge over competitors. Thus, manufacturing companies have dedicated time and resources to identify methods and/or arrangements for improving substrate processing.

A typical processing system that may be employed to perform substrate processing may be a capacitively-coupled plasma (CCP) processing system. The plasma processing system may be built to enable processing in a range of process parameters. However, in recent years, the types of devices that may be processed have become more sophisticated and may require more precise process control. For example, devices being processed are becoming smaller with finer features and may require more precise control of plasma parameters, such as plasma density and uniformity across the substrate, for better yield. Pressure control of the wafer area in the etching chamber may be an example of a process parameter affecting plasma density and uniformity.

The manufacturing of semiconductor devices may require multi-step processes employing plasma within a plasma processing chamber. During plasma processing of semiconductor device(s), the plasma processing chamber may typically be maintained at a predefined pressure for each step of the process. The predefined pressure may be achieved through employing mechanical vacuum pump(s), turbo pump(s), confinement ring positioning and/or combinations thereof, as is well known by those skilled in the art.

Conventionally, a valve assembly may be employed to throttle the exhaust turbo pump(s) to attain pressure control for maintaining predefined pressure conditions in the plasma processing chamber. Alternatively or additionally, the pressure in the plasma generating region of the plasma processing chamber (e.g., the region encapsulated by the two electrodes and surrounded by the confinement rings) may be controlled by adjusting the gaps between the confinement rings of a confinement ring assembly. Adjusting the gaps controls the flow rate of exhaust gas from the plasma generating region and pressure may be affected as a result. The overall gas flow conductance out of the plasma generating region may depend on several factors, including but not limited to, the number of confinement rings and the size of the gaps between the confinement rings.

In view of the need to process the substrate in multiple steps, each of which may involve a different pressure, improvement to the capability to efficiently control pressure in plasma processing systems is highly desirable.

SUMMARY OF THE INVENTION

The Invention relates, in an embodiment, to a plasma processing system having a plasma processing chamber for processing a substrate. The plasma processing chamber includes an upper electrode, the upper electrode having a first upper electrode portion and a second upper electrode portion. The first upper electrode portion annularly surrounds the second upper electrode portion. Both the first upper electrode portion and the second upper electrode portion are grounded during the processing. The plasma processing chamber also includes a lower electrode, the lower electrode having a first lower electrode portion and a second lower electrode portion. The first lower electrode portion is grounded and annularly surrounds the second lower electrode portion. The second lower electrode portion has a substrate bearing surface configured to support the substrate during the processing, wherein at least one of the upper electrode and the lower electrode is movable in a direction that is perpendicular to the substrate bearing surface. The plasma processing chamber also includes a RF power source for providing RF energy to the second lower electrode portion, wherein an upper surface of the first lower electrode portion is non-planar with respect to the substrate-bearing surface such that a first gap between the upper surface of the first lower electrode portion and a lower surface of the first upper electrode portion is smaller than a second gap between the substrate bearing surface and a substrate-facing surface of the second upper electrode portion.

In one embodiment, a plasma processing system having a plasma processing chamber for processing a substrate is provided. The plasma processing chamber includes an upper electrode and a lower electrode. The upper electrode includes a first upper electrode portion and a second upper electrode portion, and the first upper electrode portion annularly surrounds the second upper electrode portion. The lower electrode includes a first lower electrode portion and a second lower electrode portion, and the first lower electrode portion annularly surrounds the second lower electrode portion. The second lower electrode portion has a substrate bearing surface configured to support the substrate during the substrate processing. At least one of the upper electrode and the lower electrode is movable in a direction that is perpendicular to the substrate bearing surface. The lower surface of the first upper electrode portion is non-planar with the substrate-facing surface of the second upper electrode portion such that a first gap between the lower surface of the first upper electrode portion and the upper surface of the first lower electrode portion is smaller than a second gap between the substrate bearing surface of the second lower electrode portion and the substrate-facing surface of the second upper electrode portion. The plasma processing system further includes a radio frequency (RF) power source for providing RF energy to the second lower electrode portion.

In another embodiment, a plasma processing system having a plasma processing chamber for processing a substrate is provided. The plasma processing chamber includes an upper electrode and a lower electrode. The upper electrode having a first upper electrode portion and a second upper electrode portion, and the first upper electrode portion annularly surrounds the second upper electrode portion. Both of the first upper electrode portion and the second upper electrode portion is grounded during the substrate processing. The lower electrode includes a first lower electrode portion and a second lower electrode portion, and the first lower electrode portion is grounded. The first lower electrode portion is also electrically separated from and annularly surrounds the second lower electrode portion. The second lower electrode portion has a substrate bearing surface configured to support the substrate during the substrate processing. At least one of the upper electrode and the lower electrode is movable in a direction that is perpendicular to the substrate bearing surface. The lower surface of the first upper electrode portion extends below a substrate-facing surface of the second upper electrode portion such that a first gap between the lower surface of the first upper electrode portion and the upper surface of the first lower electrode portion is smaller than a second gap between the substrate bearing surface of the lower electrode portion and the substrate-facing surface of the second upper electrode portion. The plasma processing system further includes a radio frequency (RF) power source for providing RF energy to the second lower electrode portion.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with embodiments of the invention, there are provided methods and apparatus for configuring plasma processing systems to achieve rapid control over plasma processing parameters. In some plasma processing systems, the chamber gap (i.e., the gap between the upper and lower electrode) is a recipe parameter and may vary from step to step. In these plasma processing systems, there may be provided a mechanism configured to move the lower electrode assembly to adjust the chamber gap. In other plasma processing systems, the upper electrode assembly may be moved. In the disclosure herein, the chamber is assumed to have a moving lower electrode. It should be understood, however, that embodiments of the invention herein apply equally well to chambers in which the upper electrode is movable (alternatively or additionally).

When the chamber gap is moved in response to recipe requirements, the volume of the plasma generating region is changed. This change in volume affects the pressure within the plasma generating region, requiring compensation to adjust for the pressure change. In the prior art, as mentioned, pressure control is achieved by controlling the throttle valve position upstream of the exhaust turbo pump and/or by controlling the position of the confinement rings to change the gaps between the confinement rings, thereby changing the conductance of the gas exhausting from the plasma generating region.

Figure 1:
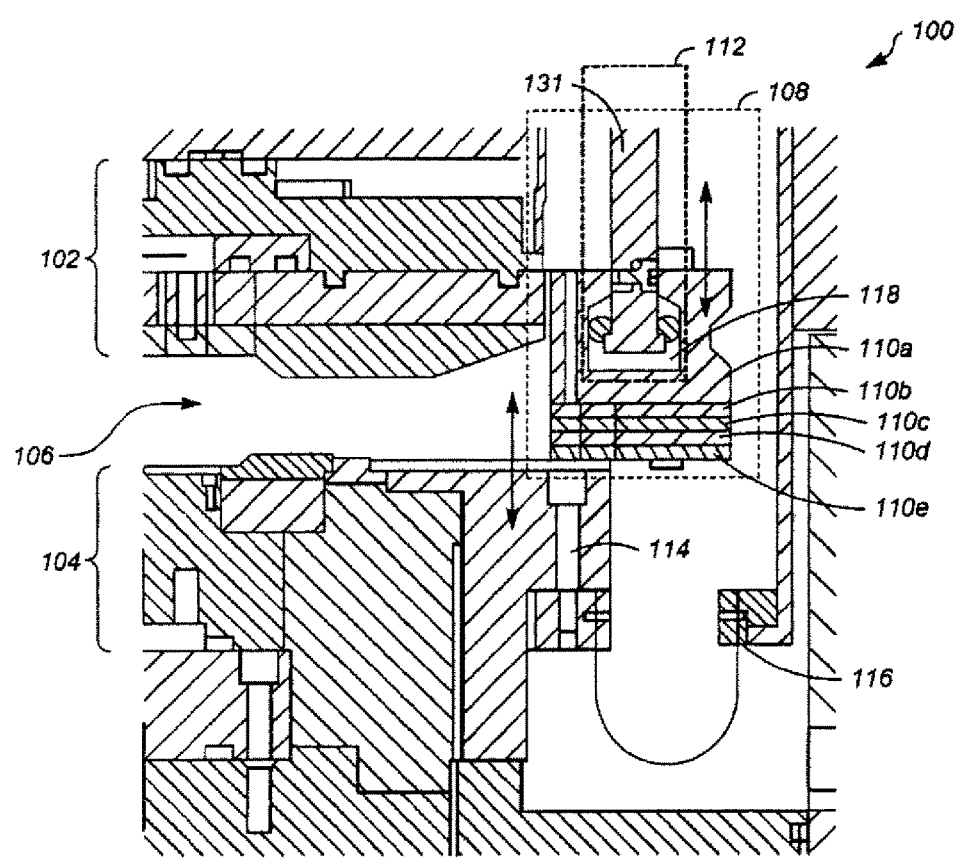
FIG. 1 shows, in accordance with an embodiment of the present invention, a simplified schematic of a plasma processing system configured to provide an adjustable gap between an upper electrode assembly and a lower electrode assembly.

Generally speaking, the confinement ring gaps may be adjusted by appropriately controlling the position of a plunger (see 131 of FIG. 1). In the upstroke of the plunger, the gaps between rings 110a, 110b, 110c, 110d, and 110e are expanded. In the down stroke of the plunger, rings 110a, 110b, 110c, 110d, and 110e collapse together in a sequential manner starting from the lower rings since the downward movement of ring 110e is arrested by the lower electrode and the downward movement of ring 110d is arrested by ring 110e, and so on. Confinement ring assemblies are well-known in the art and will not be elaborated further herein.

When pressure control is desired in the prior art, a closed-loop control system is generally employed. In an example, the pressure within the plasma generating region is measured and/or derived and then compared against the desired pressure called for by the process recipe. If there is a discrepancy, plunger 131 is moved upward or downward appropriately to change the confinement ring gaps to control the conductance through the conductance ring gaps, thereby affecting the pressure within the plasma generating region. These measure-adjust-measure-adjust cycles are performed step-wise until the desired pressure set point is achieved.

While the prior art approach is satisfactory for chambers in which the electrodes are stationary, this approach proves less than satisfactory for chambers with moving lower electrode. In these chambers, the sudden change in the volume of the plasma generating region due to lower electrode re-positioning may result in a temporary loss of closed-loop pressure control as the closed-loop control algorithm struggles to re-attain control. Even if the closed-loop control algorithm can rapidly re-acquire control to begin the adjustment process, the large and sudden change in pressure caused by the sudden repositioning of the lower electrode may cause the closed-loop control algorithm to take quite a long time to stabilize the pressure to the desired set point. During this long pressure re-stabilization period, substrate processing is effectively halted. If the pressure re-stabilization period is unduly long, productivity may suffer.

In an embodiment of the invention, there is provided a novel pressure control algorithm for rapidly compensating for the large and sudden change in the pressure in the plasma generating region that results from lower electrode (or upper electrode) repositioning. The inventor herein realizes that for a given pressure, the chamber gap (i.e., the distance between the upper and lower electrodes) relates to the confinement rings position (as determined by the position of the plunger) in roughly (though not exactly) a linear relationship. The inventor herein also realizes that for each chamber gap, the conductance (in liters/second) through the confinement rings relates to the confinement rings position (as determined by the position of the plunger) in roughly (though not exactly) a linear relationship.

Further, the inventor realizes that as the gap changes, the roughly linear relationship between the conductance and the confinement rings position is roughly maintained. By plotting the conductance versus confinement rings position curves for various chamber gaps, each conductance curve may be shown to be substantially linear and furthermore, the conductance curves are substantially parallel.

From these relationships, the inventor realizes that a rough open-loop control strategy may be employed, using confinement ring re-positioning parameters furnished by these relationships, to rapidly re-position the confinement rings to bring the pressure in the plasma generating region quickly to roughly the desired set point. Once the rough re-positioning is made in an open-loop manner, the finer close-loop control strategy may be employed to quickly bring the pressure to the desired pressure set point. However, since the open-loop re-positioning is only a rough re-positioning and is not depended upon for precise pressure control, non-linearity in conductance versus confinement rings position for various chamber gaps may be safely ignored. This key realization vastly simplifies calculation and renders the rough open-loop repositioning process rapid.

In an embodiment, the inventor deduces that rough pressure compensation for chamber gap changes may be rapidly made by calculating the offset from one conductance curve to another and by moving the confinement rings position by that amount of calculated offset. Once the rough pressure compensation is performed, closed-loop control may take over to stabilize the pressure to the desired pressure set point. In this manner, pressure compensation is achieved in two phases: 1) an open-loop first phase wherein the confinement rings are moved rapidly using the calculated offset value from previously derived conductance data, and 2) a subsequent closed-loop phase to achieve the derive pressure set point.

The features and advantages of the present invention may be better understood with reference to the figures and discussions (with prior art mechanisms and embodiments of the invention contrasted) that follow.

FIG. 1 shows, in accordance with an embodiment of the present invention, a simplified schematic of a plasma processing system configured to provide an adjustable gap between an upper electrode assembly and a lower electrode assembly. Plasma processing system 100 may be a single, double or triple frequency capacitively discharged system or may be an inductively coupled plasma system or a plasma system employing a different plasma generating and/or sustaining technology. In the example of FIG. 1, radio frequency may include, but are not limited to 2, 27 and 60 MHz.

In the example of FIG. 1, plasma processing system 100 may be configured with an upper electrode assembly 102 and a lower electrode assembly 104, in an embodiment. The upper electrode assembly 102 and lower electrode assembly 104 may be separated from each other by a chamber gap 106. The upper electrode assembly 102 may include an upper electrode that may be grounded or powered by an RF power supply (not shown).

During plasma processing, processed gas (not shown) may be supplied into chamber gap 106. The processed gas being supplied into chamber gap 106 may be excited into a plasma state by RF power supplied to lower electrode assembly 104. The plasma in chamber gap 106 may be confined by a confinement ring assembly 108 that may be configured with at least a set of confinement rings (110a, 110b, 110c, 110d, and 110e). The confinement ring assembly may also be configured with a gap control mechanism 112, including a plunger 131, for controlling the gaps between confinement rings (110a-e). Exhaust gases in chamber gap 106 (i.e., the plasma generating region) may pass through confinement-ring gaps between the set of confinement rings (110a-e). These exhaust gases may be exhausted from the chamber by a vacuum pump (not shown to simplify illustration) via a throttle valve.

In an embodiment, lower electrode assembly 104 may be configured with a piston 114 and an actuation mechanism 116 to allow lower electrode assembly 104 to be moved up or down. As a result, the volume within the plasma generating region may change, which results in a change in the pressure and thus requires compensation by confinement ring re-positioning.

Referring to FIG. 1, upon moving lower electrode assembly 104 to accommodate recipe requirements for a given step, confinement ring assembly 108 may move correspondingly with the motion of lower electrode assembly 104, thereby changing the gaps between confinement ring assembly 108. Accordingly, the pressure in the plasma generating region is altered not only by the sudden change in volume of the plasma generating region but also by the change in the confinement ring gaps.

In order to maintain the predetermined pressure (for example, the pressure that existed before lower electrode movement), the position of confinement ring assembly 108 may need to be adjusted to change the conductance (in liters/second) of the exhaust gas to compensate for the change in plasma generating region volume and/or the change in confinement ring gaps that result from lower electrode movement.

Figure 2:
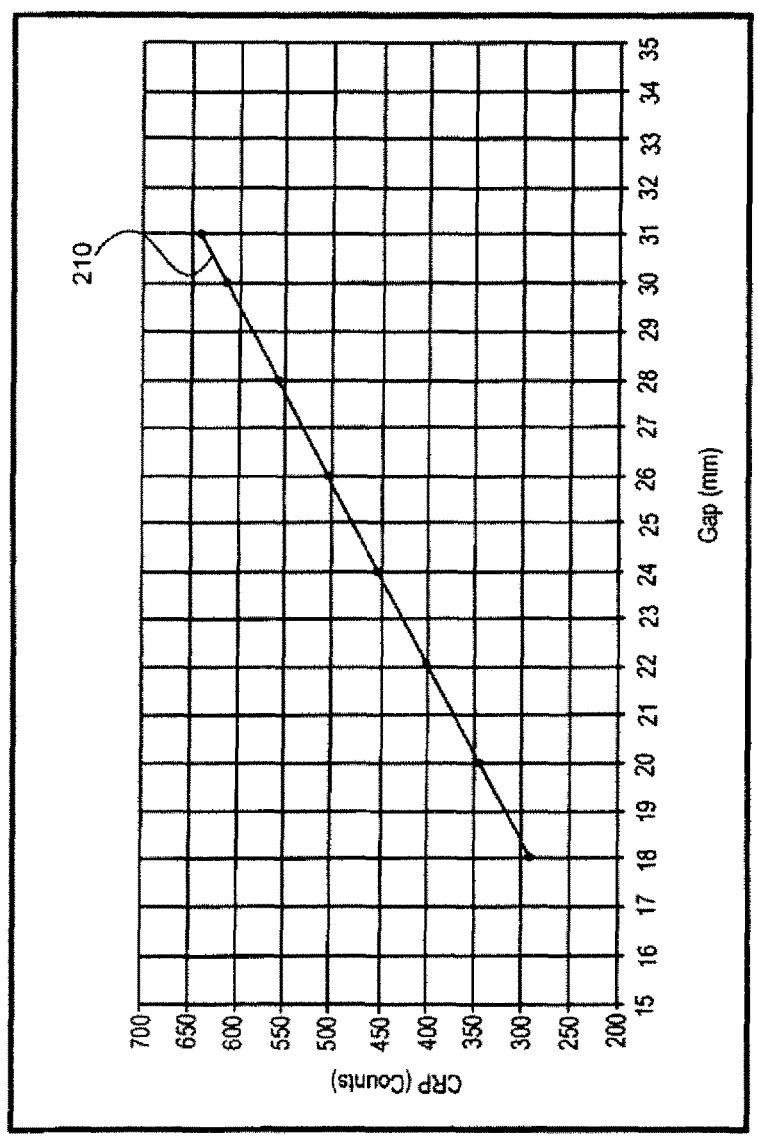
FIG. 2 shows, in accordance with an embodiment of the present invention, a plot of confinement ring position (CRP) as a function of chamber gap for a predefined pressure.

FIG. 2 shows, in accordance with an embodiment of the present invention, a plot of confinement ring position (CRP) as a function of chamber gap for a predefined pressure. FIG. 2 is discussed in relation to FIG. 1 to facilitate understanding.

As shown in FIG. 2, the vertical axis is shown as the confinement ring position in arbitrary count unit. In an implementation, the arbitrary count unit may be the servo motor index of the servo motor employed to control the up/down movement of plunger 131. The horizontal axis shows the chamber gap in millimeter (mm) Plot line 210 shows a linear relationship between confinement ring position and chamber gap for a given pressure.

Figure 3:
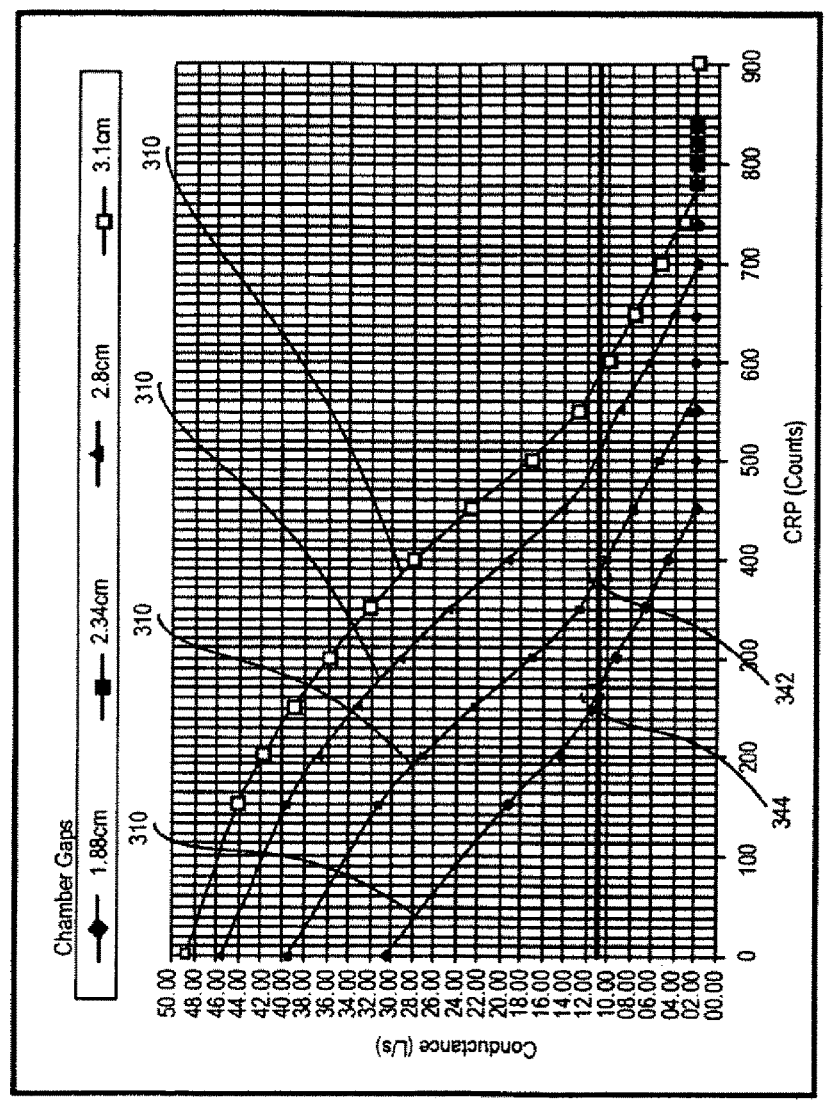
FIG. 3 shows, in accordance with an embodiment of the present invention, a plurality of empirically derived conductance curves (which illustrates conductance versus confinement ring position) for different chamber gaps.

FIG. 3 shows, in accordance with an embodiment of the present invention, a plurality of empirically derived conductance curves (which illustrates conductance versus confinement ring position) for different chamber gaps.

As shown in FIG. 3, the vertical axis is shown as conductance in liter per second (L/s). The horizontal axis is shown as the confinement ring position (CRP), again in arbitrary count unit. Plot line 310 is the conductance curve for a chamber gap value of 1.88 centimeter (cm). Plot line 320 is the conductance curve for a chamber gap value of 2.34 cm. Plot line 330 is the conductance curve for a chamber gap value of 2.8 cm. Plot line 340 is the conductance curve for a chamber gap value of 3.1 cm.

A few observations may be made from FIG. 3. First, the curves are substantially linear in the region of chamber operation, i.e., above 4 liters/sec. Second, these curves are substantially parallel, illustrating that the linear relationship between the conductance and the confinement ring position is substantially preserved when the gap is changed. Third, for any given desired conductance (such as 11 liters/second in FIG. 2), the change in conductances attributable to a change in the chamber gaps may be compensated for simply by moving the confinement ring by the amount of x-axis offset from one curve to another. With reference to FIG. 2, the change in conductance as the chamber gap is moved from 2.34 cm (curve 320) to 1.88 cm (curve 310) may be compensated for by moving the confinement ring position by an amount that is equal to the offset (between point 344 and point 342). Moving the confinement ring position by the offset (difference between point 342 and point 344) has the effect of roughly moving conductance curve 310 to superimpose on conductance curve 320. In so doing, the conductance change due to gap change is compensated for, and rough conductance compensation is achieved in an open-loop manner.

In an embodiment, the current chamber gap position may be represented by "X". The change in chamber gap may be +/–"Y". The current CRP may be represented by "A". The new chamber gap and new CRP may be calculated as followed:

New chamber gap position=$X+/-Y$ (Equation 1).

New CRP=$A+/-(M*Y)$ (Equation 2), where M is the slope determined from the conductance curves of FIG. 3.

As may be appreciated from the foregoing, the plurality of conductance curves for each chamber gap may be empirically determined in an embodiment. Over the working conductance range, the plurality of conductance curves may be relatively linear, yielding a slope of about M in an embodiment. The offset CRP values may be determined for predetermined wafer area pressure(s) to compensate for the chamber gap adjustment(s). Alternatively, a simple lookup table may be employed to correlate chamber gaps with offsets. To facilitate the open-loop rough adjustment, the corresponding offset for a particular chamber gap may be obtained and/or estimated from the values provided by the lookup table.

Figure 4:
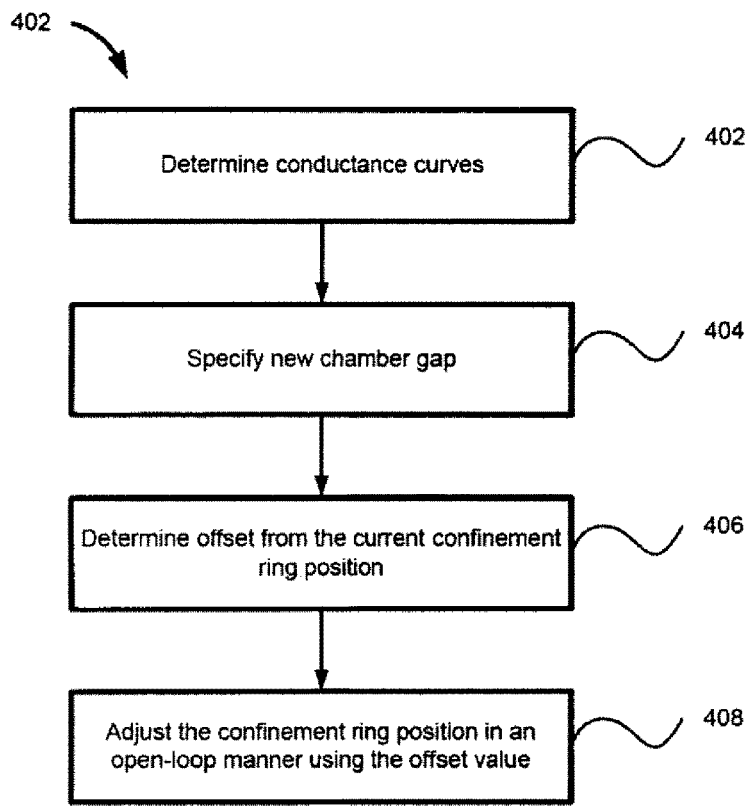
FIG. 4 shows, in accordance with an embodiment of the invention, a simplified flowchart of a method 400 for wafer area pressure control with adjustable chamber gap in real time.

FIG. 4 shows, in accordance with an embodiment of the invention, a simplified flowchart of a method 400 for wafer area pressure control with adjustable chamber gap in real time.

In step 402, a plurality of conductance curves for different chamber gaps may be empirically determined in an embodiment. In step 404, a new chamber gap is specified as part of a process recipe. In step 406, the offset from the current confinement ring position may be determined This offset has been discussed earlier in connection with FIG. 3. To simplify the calculation and/or lookup, an arbitrarily chosen reference chamber gap may be employed to provide a reference to which all other chamber gaps may be referenced to, in an embodiment.

Once the offset is acquired, the confinement ring position may be adjusted in an open-loop manner using the offset value to rapidly (but roughly) re-position the confinement rings (step 408). This rapid repositioning roughly compensates for the change in the plasma generating region volume and the change in the confinement ring gaps caused by the movement of the lower electrode. Once the rough repositioning is accomplished, fine (but slower) close-loop control, in the manner done in the prior art, may be employed to more precisely establish the pressure in the plasma generating region at a desired set point pressure. Once the pressure is re-stabilized, other changes in the pressure (such as to accommodate pressure change in a different step) may be accomplished using techniques known in the prior art.

As can be appreciated from the foregoing, embodiments of the invention permit pressure compensation to be performed in a rapid manner by rapidly repositioning the confinement rings in a two-step process. In the first step, the confinement rings are rapidly repositioned in an open-loop manner using an offset value obtained from previously acquired conductance data (which correlate conductance with confinement ring positions for various chamber gaps). In the second step, traditional closed-loop control may be employed to more precisely stabilize the pressure at the desired value. By rapidly compensating for the change in pressure that is caused by the moving electrode(s), the pressure stabilization step may be shortened, leading to improved productivity. Furthermore, embodiments of the invention may improve and or make possible the ability to sustain ignition of the plasma as the processing proceeds from step to step, each of which may call for a different chamber gap and a different pressure setting.

As mentioned, the manufacturing of semiconductor devices may require multi-step processes employing plasma within one or more plasma processing chambers. Some of the processing steps required to complete the manufacture of a device may employ different recipes that specify different plasma densities and/or different ion energies and/or different wafer bias voltages. In the prior art, these various recipes may be performed using different plasma processing chambers or systems, each of which may be configured to perform one or more recipes of the multi-recipe process.

While such an approach accomplishes the goal of fabricating the resultant device, there are disadvantages. For example, the use of multiple chambers and/or systems to accomplish the manufacture of the device increases the equipment acquisition and deployment costs and/or the maintenance burden for the device manufacturer. As another example, the use of multiple chambers and/or systems to accomplish the manufacture of the device introduces delay into the manufacturing process. This is because it takes a nontrivial amount of time to, for example, stop the process in one chamber, evacuate the chamber content, remove the substrate from the chamber, insert the substrate into another chamber of the same or a different plasma processing system, and start up the other chamber to stabilize and to begin processing the substrate. The delay increases the total amount of time required to manufacture the plasma processing system and reduces the total factory output.

In another embodiment of the invention, there is provided methods and apparatus for providing different plasma densities and/or different ion energies and/or different wafer bias voltages in-situ in the same plasma processing chamber. In one or more embodiments, the upper electrode is grounded while the lower electrode is powered. In this implementation, the periphery of the lower electrode (which is powered) is provided with an annular (i.e., donut-shaped) ring that surrounds the lower electrode and is grounded. This annular extension is referred to herein as the lower electrode ground peripheral extension (LE-GPE). Generally speaking, the LE-GPE is made of a material that is generally nonreactive or substantially unaffected by the plasma processing while still permitting RF coupling to take place when the gap above it is sufficiently large to sustain plasma. In an example, the LE-GPE is has a quartz cover or a similarly suitable cover.

The gap above the LE-GPE is to a grounded upper surface is configured such that as the gap between the upper electrode and lower electrode is sufficiently narrowed, there comes a point where the gap above the LE-GPE is insufficiently large to sustain plasma while the gap that over lies the lower electrode inside of the LE-GPE still remains sufficiently large to sustain the plasma. In this narrow-gap case, RF coupling from the powered lower electrode does not reach the LE-GPE or reach the grounded upper surface that is directly over the LE-GPE, and plasma is sustained only in the volume that is directly over the lower electrode.

As the gap between the upper electrode and lower electrode is gradually enlarged, there comes a point where the gap above the LE-GPE is sufficiently large to sustain plasma while the gap that over lies the lower electrode inside of the LE-GPE is also sufficiently large to sustain the plasma. In this wide-gap case, RF coupling from the powered lower electrode reaches the LE-GPE and also reaches the grounded upper surface that is directly over the LE-GPE and plasma is sustained only in the volume that is directly over the lower electrode.

It can be seen then that in both the narrow-gap case and the wide-gap case, the effective RF coupling area of the powered lower electrode remains the same. However, in the wide-gap case, the effective RF coupling area of the grounded electrode is enlarged (since RF coupling also reaches the LE-GPE and the grounded area that is above the LE-GPE. Accordingly, it may be readily seen that the narrow-gap case may provide for one area ratio of RF coupling (defined as the ratio between the effective RF ground coupling area divided by the effective RF powered electrode coupling area) while in the wide-gap case, the area ratio of RF coupling is larger due to a larger effective RF ground coupling area.

In an embodiment, the difference in the gaps (i.e., the gap between the upper electrode and the lower electrode at the central region of the lower electrode and the gap above the LE-GPE) may be accomplished by making the LE-GPE non co-planar with the lower electrode. For example, the LE-GPE may be raised above the lower electrode. The LE-GPE moves together with the lower electrode in designs wherein the lower electrode is movable. The grounded area that overlies the LE-GPE moves with the upper electrode in designs wherein the upper electrode is movable.

In another embodiment, the grounded area that overlies the LE-GPE may, alternatively or additionally, be made non co-planar with the upper electrode. For example, the grounded area the overlies the LE-GPE may alternatively or additionally protrudes below the lower surface of the upper electrode. The LE-GPE moves together with the lower electrode in designs wherein the lower electrode is movable. The grounded area that overlies the LE-GPE moves with the upper electrode in designs wherein the upper electrode is movable.

Alternatively or additionally to the above, the grounded area that overlies the LE-GPE may be considered an annular extension of the upper electrode, or an upper electrode grounded peripheral extension (UE-GPE). Again, the LE-GPE moves together with the lower electrode in designs wherein the lower electrode is movable. The UE-GPE that overlies the LE-GPE moves with the upper electrode in designs wherein the upper electrode is movable.

Figure 5:
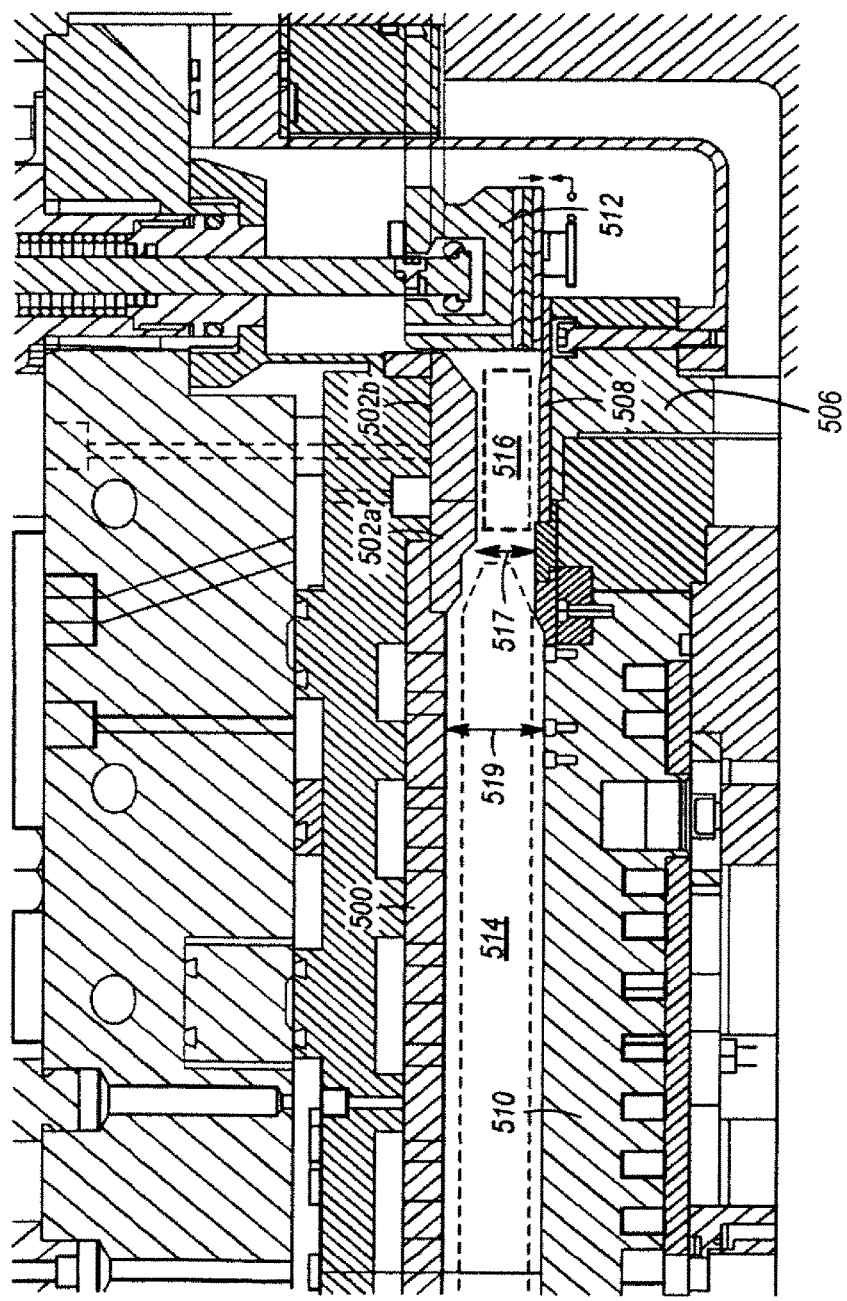
FIG. 5 shows, in accordance with an embodiment of the invention, a simplified chamber for achieving in-situ control of area ratio of RF coupling change.

FIG. 5 shows, in accordance with an embodiment, an implementation wherein a non co-planar UE-GPE is provided. In the case of FIG. 5, the UE-GPE extends or protrudes below the lower surface of upper electrode 500. In the example of FIG. 5, the UE-GPE is formed of two components 502a and 502b although such is not a requirement. Both upper electrode 500 and the UE-GPE 502a/502b are grounded.

A lower electrode grounded peripheral extension (LE-GPE) 506 is also shown having a quartz cover 508. LE-GPE 506 is peripheral to a lower electrode 510 as shown. Lower electrode 510 is typically powered, e.g., by a RF power source (not shown). A plurality of confinement rings 512 is also shown in FIG. 5.

In FIG. 5, there are two plasma sustaining regions: region 516 which is capable of sustaining plasma in the wide-gap configuration where gap 517 is sufficiently large to sustain a plasma; and a region 514 which is capable of sustaining plasma whenever gap 519 is sufficiently large to sustain plasma.

Figure 6:
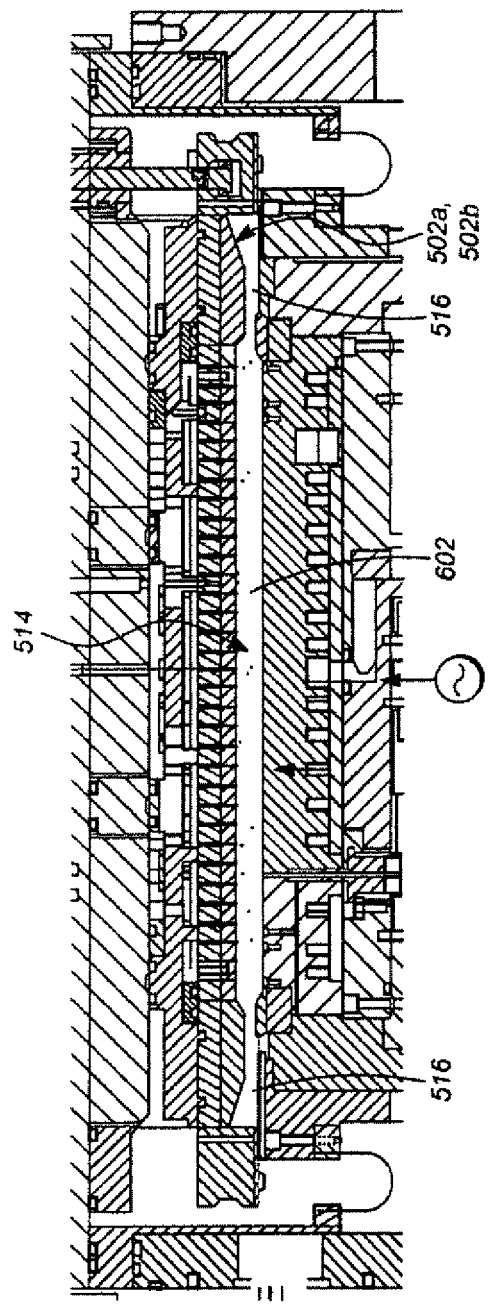
FIG. 6 shows, in accordance with an embodiment of the invention, the narrow-gap configuration.

In FIG. 6, the narrow gap configuration is illustrated wherein gap 517 is insufficiently large (relative to the mean free path) to sustain plasma in the region denoted by reference number 516 in FIG. 5. However, gap 519 is still sufficiently large to sustain plasma in the region denoted by reference number 514 in FIG. 5. In this case, RF coupling is between powered lower electrode 510 and upper electrode 500 (as illustrated by arrow 602) and the area ratio of RF coupling is defined by the effective RF coupling area of the grounded upper electrode 500 divided by effective RF coupling area of the powered lower electrode 510.

Figure 7:
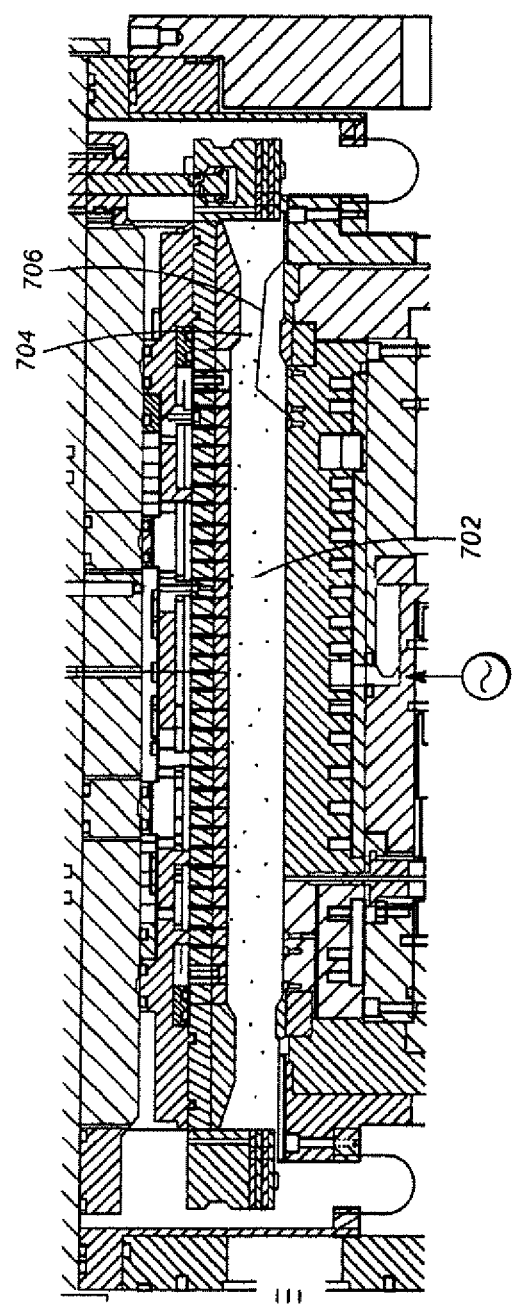
FIG. 7 shows, in accordance with an embodiment of the invention, the wide-gap configuration.

In FIG. 7, the wide gap configuration is illustrated wherein gap 517 is sufficiently large to sustain plasma in the region denoted by reference number 516 in FIG. 5. Further, gap 519, being larger than gap 517, is still sufficiently large to sustain plasma in the region denoted by reference number 514 in FIG. 5. In this case, RF coupling is between powered lower electrode 510 and upper electrode 500 (as illustrated by arrow 702), as well as between powered lower electrode 510 and UE-GPE 502a/502b (as illustrated by arrow 704), as well as between powered lower electrode 510 and LE-GPE 506 through quarts surface 508 (as illustrated by arrow 706). Since the area ratio of RF coupling is defined by the effective RF coupling area of the grounded electrode divided by effective RF coupling area of the powered lower electrode 510, the area ratio has been increased. This is because the effective RF coupling area that is grounded is now increased by the area of the LE-GPE 506 as well as the UE-GPE 502a/502b.

In either the wide-gap configuration or the narrow-gap configuration, it is possible to retain all the advantages discussed earlier, e.g., changing the volume to change the plasma density by keeping the RF power the same or obtaining different plasma densities. The movable electrode, together with differentiated plasma sustaining volumes that can be independently controlled (by moving the gap) effectively offers more granular control of the, for example, ion energies and/or wafer bias voltages and/or plasma density in-situ.

In an embodiment, the upper electrode and lower electrode are sized such that in the narrow-gap configuration, a 1:1 area ratio is achieved, making the chamber a symmetric chamber in the narrow gap configuration. In the wide-gap configuration, since the effective RF coupling area of the ground electrode is increased, the area ratio becomes larger 1:1, rendering the chamber asymmetric. Thus, an in-situ method for making the chamber symmetric or asymmetric is achieved to accommodate different recipes.

Although the examples above illustrates only two differentiated plasma-sustaining volumes (e.g., 514 and 516 in FIG. 5), the area that is periphery to the lower electrode may be provided with multi-steps (e.g., two steps, three steps, four steps, etc.,) to create multiple gaps of different sizes to achieve additional differentiated plasma-sustaining volumes that can be inhibited by making the respective gaps too small to effectively sustain the plasma.

It should be noted that embodiments of FIGS. 5, 6, and 7 may be practiced together with the features of the earlier figures or may be practiced independently of the features disclosed in the earlier figures.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. If the term "set" is employed herein, such term is intended to have its commonly understood mathematical meaning to cover zero, one, or more than one member. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A plasma processing system having a plasma processing chamber for processing a substrate, said plasma processing chamber comprising:
    an upper electrode, said upper electrode having a first upper electrode portion and a second upper electrode portion, said first upper electrode portion annularly surrounding said second upper electrode portion;
    a lower electrode, said lower electrode having a first lower electrode portion and a second lower electrode portion, said first lower electrode portion annularly surrounding said second lower electrode portion and being disposed opposite the first upper electrode portion, said second lower electrode portion having a substrate bearing surface configured to support said substrate during said processing; and
    a radio frequency (RF) power source for providing RF energy to said second lower electrode portion, wherein a lower surface of said first upper electrode portion defines a protrusion that extends toward the first lower electrode portion of the lower electrode and is not co-planar with a substrate-facing surface of said second upper electrode portion such that a first gap between said lower surface of said first upper electrode portion and an upper surface of said first lower electrode portion is smaller than a second gap between said substrate bearing surface of said second lower electrode portion and said substrate-facing surface of said second upper electrode portion, wherein a first angled step at the inner circumference of the first upper electrode portion transitions to a second angled step that transitions onto the protrusion and a gradual transition extending to an outer circumference of the first upper electrode portion to transition off of the protrusion;
    wherein the protrusion enables the plasma processing chamber to be operable in two regimes, a first regime involves sustaining of plasma within the second gap and within the first gap, a second regime involves sustaining of plasma within the second gap and a reduction of sustaining of plasma within the first gap.

2. The plasma processing system of claim 1, wherein both said first upper electrode portion and said second upper electrode portion of said upper electrode are grounded during said processing.

3. The plasma processing system of claim 1, wherein said first lower electrode portion of said lower electrode is grounded during said processing.

4. The plasma processing system of claim 1, wherein one of said upper electrode and said lower electrode is movable in a direction that is perpendicular to the substrate bearing surface.

5. The plasma processing system of claim 1, wherein both said upper electrode and said lower electrode are movable.

6. The plasma processing system of claim 1, wherein said upper surface of said first lower electrode portion is substantially co-planar with said substrate bearing surface of said second lower electrode portion.

7. The plasma processing system of claim 1, wherein said upper surface of said first lower electrode portion is not co-planar with said substrate bearing surface of said second lower electrode portion.

8. The plasma processing system of claim 1, wherein the first regime provides one or both of said upper electrode and said lower electrode to be further apart for the sustaining of plasma within the first gap and within the second gap, the second regime provides one or both of said upper electrode and said lower electrode to be closer together for the sustaining of plasma within the second gap and the reduction of sustaining of plasma within the first gap.

9. The plasma processing system of claim 8, wherein an area ratio of RF coupling between said upper electrode and said lower electrode is about 1:1 in said second regime.

10. The plasma processing system of claim 1, wherein the protrusion further includes a flat surface between the second angled step and the gradual transition, wherein the flat surface of the protrusion faces toward the first lower electrode portion.

11. A plasma processing system having a plasma processing chamber for processing a substrate, said plasma processing chamber comprising:
    an upper electrode, said upper electrode having a first upper electrode portion and a second upper electrode portion, said first upper electrode portion annularly surrounding said second upper electrode portion, both said first upper electrode portion and said second upper electrode portion being grounded during said processing;
    a lower electrode, said lower electrode having a first lower electrode portion and a second lower electrode portion, said first lower electrode portion being grounded and being electrically separated from and annularly surrounding said second lower electrode portion, wherein the first lower electrode portion is disposed opposite said first upper electrode portion, said second lower electrode portion having a substrate bearing surface configured to support said substrate during said processing; and
    a radio frequency (RF) power source for providing RF energy to said second lower electrode portion, wherein a lower surface of said first upper electrode portion extends as a protrusion below a substrate-facing surface of said second upper electrode portion such that a first gap between said lower surface of said first upper electrode portion and an upper surface of said first lower electrode portion is smaller than a second gap between said substrate bearing surface of said lower electrode portion and said substrate-facing surface of said second upper electrode portion, wherein a first angled step at an inner circumference of the first upper electrode portion transitions to a second angled step that transitions onto the protrusion of the first upper electrode portion and a gradual transition transitions off of the protrusion and extends to an outer circumference of said first upper electrode portion;

wherein the protrusion enables the plasma processing chamber to be operable in two regimes, a first regime involves sustaining of plasma within the second gap and within the first gap, a second regime involves sustaining of plasma within the second gap and a reduction of sustaining of plasma within the first gap.

12. The plasma processing system of claim 11, wherein said upper surface of said first lower electrode portion is substantially co-planar with said substrate bearing surface of said second lower electrode portion.

13. The plasma processing system of claim 11, wherein said upper surface of said first lower electrode portion is not co-planar with said substrate bearing surface of said second lower electrode portion.

14. The plasma processing system of claim 11, wherein the first regime provides one or both of said upper electrode and said lower electrode to be further apart for the sustaining of plasma within the first gap and within the second gap, the second regime provides one or both of said upper electrode and said lower electrode to be closer together for the sustaining of plasma within the second gap and the reduction of sustaining of plasma within the first gap.

15. The plasma processing system of claim 14, wherein an area ratio of RF coupling between said upper electrode and said lower electrode is about 1:1 in said second regime.

16. The plasma processing system of claim 11, wherein said first upper electrode portion of said upper electrode moves with said second upper electrode portion of said upper electrode.

17. The plasma processing system of claim 11, wherein one of said upper electrode and said lower electrode is movable in a direction that is perpendicular to the substrate bearing surface.

18. The plasma processing system of claim 11, wherein both said upper electrode and said lower electrode are movable.

19. The plasma processing system of claim 11, wherein the protrusion further includes a flat surface between the second angled step and the gradual transition, wherein the flat surface of the protrusion faces toward the first lower electrode portion.

20. A plasma processing chamber, comprising:

an upper electrode, said upper electrode having a first upper electrode portion and a second upper electrode portion, said first upper electrode portion annularly surrounding said second upper electrode portion, both said first upper electrode portion and said second upper electrode portion being grounded during said processing; and a lower electrode, said lower electrode having a first lower electrode portion and a second lower electrode portion, said first lower electrode portion being grounded and being electrically separated from and annularly surrounding said second lower electrode portion, wherein the first lower electrode portion is disposed opposite said first upper electrode portion, said second lower electrode portion having a substrate bearing surface configured to support said substrate during said processing;

wherein a lower surface of said first upper electrode portion extends as a protrusion below a substrate-facing surface of said second upper electrode portion such that a first gap between said lower surface of said first upper electrode portion and an upper surface of said first lower electrode portion is smaller than a second gap between said substrate bearing surface of said lower electrode portion and said substrate-facing surface of said second upper electrode portion, wherein a first angled step at an inner circumference of the first upper electrode portion transitions to a second angled step that transitions onto the protrusion of the first upper electrode portion and a gradual transition transitions off of the protrusion and extends to an outer circumference of said first upper electrode portion, the protrusion further including a flat surface facing toward the first lower electrode portion disposed between the first angled step and the gradual transition.

* * * * *